(12) United States Patent
Yang et al.

(10) Patent No.: US 12,159,899 B2
(45) Date of Patent: *Dec. 3, 2024

(54) SEMICONDUCTOR DEVICE

(71) Applicant: TAIWAN SEMICONDUCTOR MANUFACTURING COMPANY LTD., Hsinchu (TW)

(72) Inventors: Jung-Chan Yang, Taoyuan (TW); Hui-Zhong Zhuang, Kaohsiung (TW); Chih-Liang Chen, Hsinchu (TW); Ting-Wei Chiang, New Taipei (TW); Cheng-I Huang, Hsinchu (TW); Kuo-Nan Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/335,162

(22) Filed: Jun. 15, 2023

(65) Prior Publication Data

US 2023/0326963 A1 Oct. 12, 2023

Related U.S. Application Data

(63) Continuation of application No. 17/037,438, filed on Sep. 29, 2020, now Pat. No. 11,735,625.

(60) Provisional application No. 62/928,239, filed on Oct. 30, 2019.

(51) Int. Cl.
*H01L 29/06* (2006.01)
*H01L 27/092* (2006.01)

(52) U.S. Cl.
CPC ........ *H01L 29/0653* (2013.01); *H01L 27/092* (2013.01)

(58) Field of Classification Search
CPC combination set(s) only.
See application file for complete search history.

(56) References Cited

U.S. PATENT DOCUMENTS

| | | | |
|---|---|---|---|
| 2006/0138464 A1* | 6/2006 | Shimamura | G06F 30/392 257/E27.108 |
| 2006/0226530 A1* | 10/2006 | Dinter | G06F 30/39 257/691 |
| 2016/0293689 A1* | 10/2016 | Ma | H01L 28/20 |
| 2020/0057830 A1* | 2/2020 | Azmat | H01L 27/0207 |

* cited by examiner

*Primary Examiner* — Mark W Tornow
*Assistant Examiner* — Priya M Rampersaud
(74) *Attorney, Agent, or Firm* — WPAT LAW; Anthony King

(57) ABSTRACT

A semiconductor device including a first oxide definition (OD) strip doped by a first-type dopant in a first doping region defining an active region of a first Metal-Oxide Semiconductor (MOS); a second OD strip doped by a second-type dopant in a second doping region and a third doping region, the second doping region defining an active region of a second MOS and the third doping region defining a body terminal of the first MOS, wherein the second OD is parallel to the first OD strip; and a first dummy OD strip, wherein a boundary between the second doping region and the third doping region is formed over the first dummy OD strip; wherein the first-type dopant is different from the second-type dopant.

20 Claims, 18 Drawing Sheets

SEMICONDUCTOR DEVICE

CROSS-REFERENCE TO RELATED APPLICATION

This application is a continuation of U.S. application Ser. No. 17/037,438, filed on Sep. 29, 2020, which claims the benefit of U.S. Provisional Application No. 62/928,239, filed on Oct. 30, 2019, which are incorporated by reference in their entirety.

BACKGROUND

With the advanced process of semiconductor devices, the cell height of a cell in the semiconductor device is further reduced for density boost. Therefore, the distance between two oxide definition (OD) strips is accordingly reduced, and also the width of the N-well, P+ and N+ region. With such configurations, it is hard for the designers to design the layout of a body terminal of a Metal-Oxide Semiconductor (MOS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
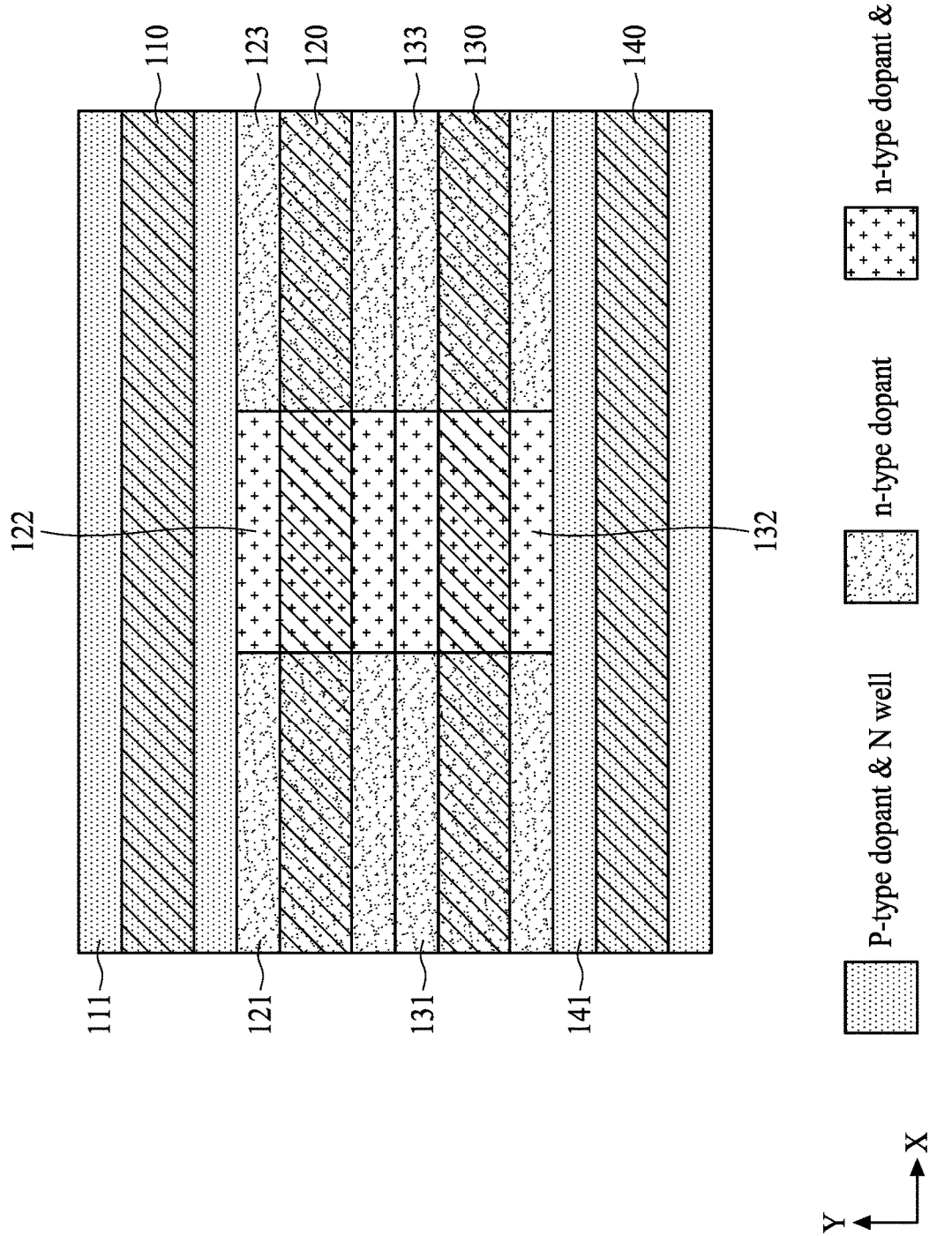
FIG. 1 is a diagram illustrating a cell in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a cell 10 in accordance with an embodiment of the present disclosure. In this embodiment, the cell 10 is regarded as a cell that provides body terminals for the transistors formed around the cell 10. The cell 10 can be included in a semiconductor device which is not limited by the present disclosure.

As shown in FIG. 1, the cell 10 includes a first oxide definition (OD) strip 110, a second OD strip 120, a third OD strip 130 and a fourth strip 140, wherein the first OD strip 110, the second OD strip 120, the third OD strip 130 and the fourth OD strip 140 extends in x direction and are arranged in y direction. It should be noted that, FIG. 1 only shows a portion of those OD strips. In an embodiment, the OD strips may extend in x direction on both ends which are not shown in FIG. 1, and the cell 10 is composed by the shown portion of these OD strips.

Those skilled in the art should understand that the OD strip defines an active region, which can be configured to be source terminal or drain terminal, of a Metal-Oxide-Semiconductor (MOS). In addition, those skilled in the art should understand that, for a p-type MOS (PMOS), the source/drain terminal is doped with p-type dopant while the body terminal thereof is doped with n-type dopant. On the other hand, for an n-type MOS (NMOS), the source/drain terminal is doped with n-type dopant while the body terminal thereof is doped with p-type dopant.

The cell 10 further includes a doping region 111 disposed on the first OD strip 110, wherein the doping region 111 includes p-type dopant for being an active region (e.g., a source or a drain) of a PMOS. Moreover, the cell further includes doping regions 121, 122, and 123 disposed on the second OD strip 120. The doping regions 121, 122 and 123 include n-type dopant, wherein the doping regions 121 and 123 are configured to be active region (e.g., a source or a drain) of an NMOS, and the doping region 122 is configured to a body terminal of a PMOS. In an embodiment, the doping region 122 is configured to be a body terminal of a PMOS on the first OD strip 110.

Furthermore, the cell 10 further includes doping regions 131, 132, and 133 disposed on the third OD strip 130. The doping regions 131, 132 and 133 include n-type dopant, wherein the doping regions 131 and 133 are configured to be active region (e.g., a source or a drain) of an NMOS, and the doping region 132 is configured to a body terminal of a PMOS. In an embodiment, the doping region 132 is configured to be a body terminal of a PMOS on the fourth OD strip 140. In addition, the cell 10 further includes a doping region 141 disposed on the fourth OD strip 140, wherein the doping region 141 includes p-type dopant for being an active region (e.g., a source or a drain) of a PMOS.

Those skilled in the art should readily understand that the doping regions 111 and 141 as the source/drain terminal of PMOS and the doping regions 122 and 132 as the body terminal of PMOS should overlap a layer indicative of N-well. However, the N-well layer is omitted here in FIG. 1 for better understanding.

In this embodiment, the doping region 122 including n-type dopant is configured to be a body terminal of PMOS on the first OD strip 110. However, this is not a limitation of the present disclosure. In other embodiments, the doping region 122 can also be a body terminal of those PMOSs on a farther OD strip. For example, the doping region 122 is a body terminal of PMOS on the first OD strip 110, meanwhile, also a body terminal of PMOS on an OD strip farther in y direction.

Likewise, the doping region 132 including n-type dopant is configured to be a body terminal PMOS on the fourth OD strip 140. However, this is not a limitation of the present disclosure. In other embodiments, the doping region 132 can also be a body terminal of those PMOSs on farther OD strip. For example, the doping region 132 is a body terminal of PMOS on the fourth OD strip 140, meanwhile, also a body terminal of PMOS on an OD strip farther in −y direction.

Figure 2:
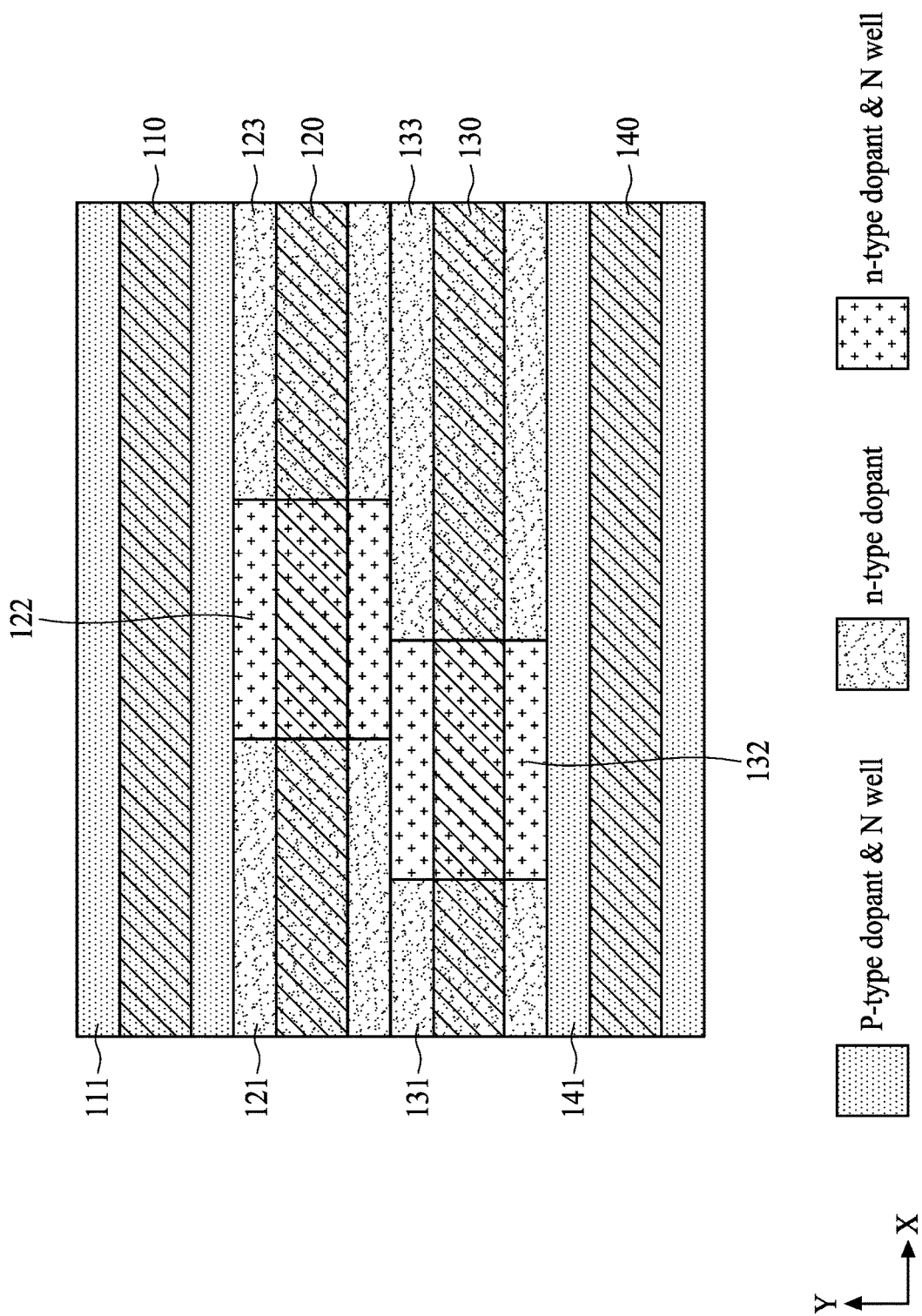
FIG. 2 is a diagram illustrating a cell in accordance with another embodiment of the present disclosure.

In FIG. 1, the doping regions 122 and 132 as body terminals of PMOS are aligned in y direction. However, this is not a limitation of the present disclosure. In other embodiments, the doping regions 122 and 132 can be arranged in y direction with deviation. Refer to FIG. 2, the doping regions 122 and 132 are not aligned in y-direction. Instead, there is a deviation between the doping regions 122 and 132 in y-direction. Those skilled in the art should understand that the size of the cell 10 is smallest when the doping regions 122 and 132 are aligned in y-direction. In addition, the process of manufacturing the cell 10 is easier when the doping regions 122 and 132 are aligned in y-direction, which reduce the risk of failing the process.

Figure 3:
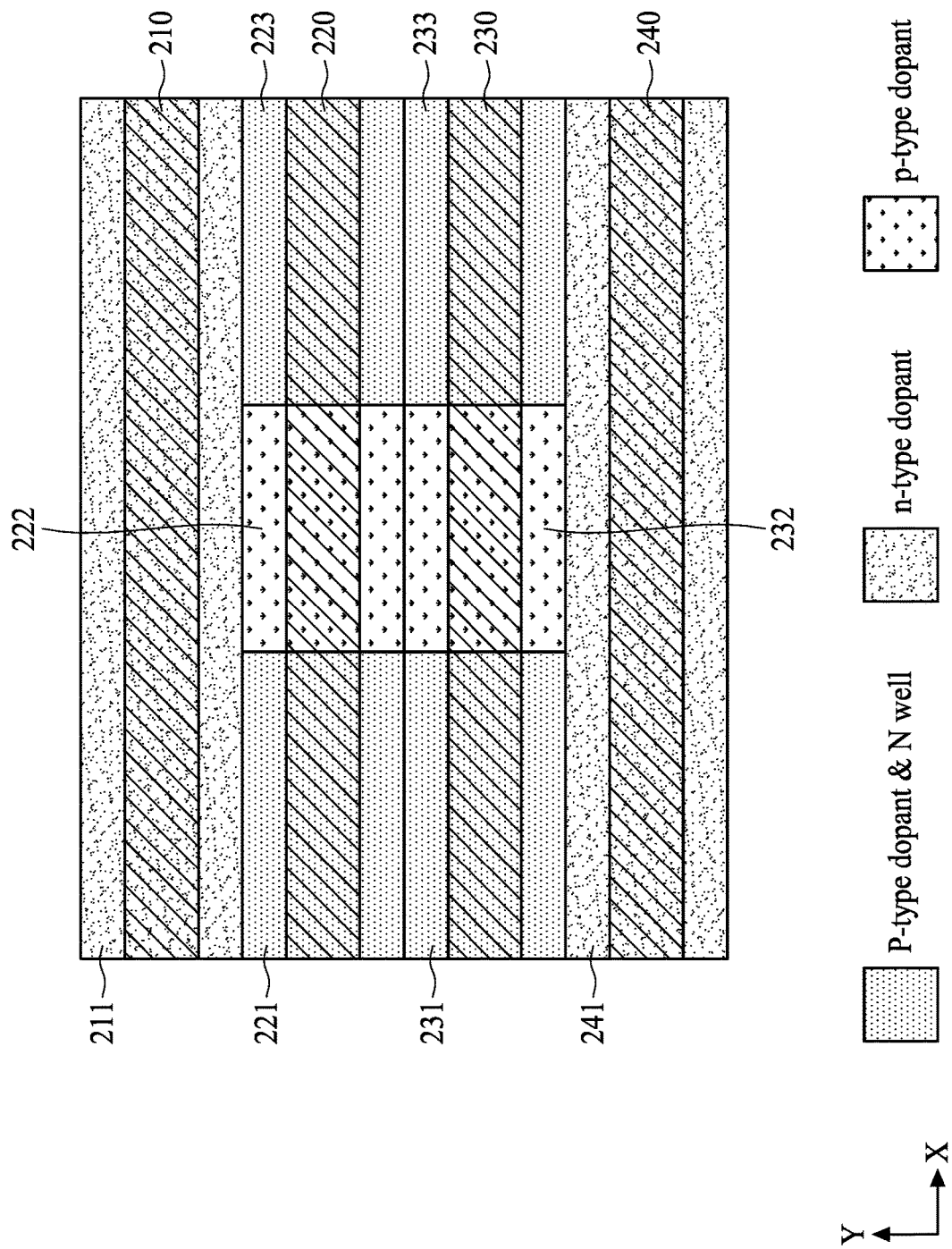
FIG. 3 is a diagram illustrating a cell in accordance with another embodiment of the present disclosure.

FIG. 3 is a diagram illustrating a cell 20 in accordance with an embodiment of the present disclosure. In this embodiment, the cell 20 is regarded as a cell that provides body terminals for the transistors formed around the cell 20. The cell 20 can be included in a semiconductor device which is not limited by the present disclosure.

As shown in FIG. 3, the cell 20 includes a first oxide definition (OD) strip 210, a second OD strip 220, a third OD strip 230 and a fourth strip 240, wherein the first OD strip 210, the second OD strip 220, the third OD strip 230 and the fourth OD strip 240 extends in x direction and are arranged in y direction. It should be noted that, FIG. 3 only shows a portion of those OD strips. In an embodiment, the OD strips may extend in x direction on both ends which are not shown in FIG. 3, and the cell 20 is composed by the shown portion of these OD strips.

The cell 20 further includes a doping region 211 disposed on the first OD strip 210, wherein the doping region 211 includes n-type dopant for being an active region (e.g., a source or a drain) of an NMOS. Moreover, the cell 20 further includes doping regions 221, 222, and 223 disposed on the second OD strip 220. The doping regions 221, 222 and 223 include p-type dopant, wherein the doping regions 221 and 223 are configured to be active region (e.g., a source or a drain) of a PMOS, and the doping region 222 is configured to a body terminal of an NMOS. In an embodiment, the doping region 222 is configured to be a body terminal of an NMOS on the first OD strip 210.

Furthermore, the cell 20 further includes doping regions 231, 232, and 233 disposed on the third OD strip 230. The doping regions 231, 232 and 233 include p-type dopant, wherein the doping regions 231 and 233 are configured to be active region (e.g., a source or a drain) of a PMOS, and the doping region 232 is configured to a body terminal of an NMOS. In an embodiment, the doping region 232 is configured to be a body terminal of an NMOS on the fourth OD strip 240. In addition, the cell 20 further includes a doping region 241 disposed on the fourth OD strip 240, wherein the doping region 241 includes n-type dopant for being an active region (e.g., a source or a drain) of an NMOS.

Those skilled in the art should readily understand that the doping regions 221, 223, 231 and 233 as the source/drain terminal of PMOS should overlap a layer indicative of N-well. However, the N-well layer is omitted here in FIG. 3 for better understanding.

In this embodiment, the doping region 222 including p-type dopant is configured to be a body terminal of NMOS on the first OD strip 210. However, this is not a limitation of the present disclosure. In other embodiments, the doping region 222 can also be a body terminal of those NMOSs on a farther OD strip. For example, the doping region 222 is a body terminal of NMOS on the first OD strip 210, meanwhile, also a body terminal of NMOS on an OD strip farther in y direction.

Likewise, the doping region 232 including p-type dopant is configured to be a body terminal NMOS on the fourth OD strip 240. However, this is not a limitation of the present disclosure. In other embodiments, the doping region 232 can also be a body terminal of those NMOSs on a farther OD strip. For example, the doping region 232 is a body terminal of NMOS on the fourth OD strip 240, meanwhile, also a body terminal of NMOS on an OD strip farther in −y direction.

As mentioned above, the size of the semiconductor device is getting smaller with the advanced process. Normally, the process of manufacturing the cells providing body terminals of transistors includes a cut-off operation to cut the OD strip. However, the reduced cell height makes the process more difficult, and the risk of failing the process increases. The cells 10 and 20 provides body terminals for the transistors without any cut-off operation to cut the OD strip. With such configurations, the processing of manufacturing the cells 10 and 20 is easier, and the risk of failing the process will be reduced.

Figure 4:
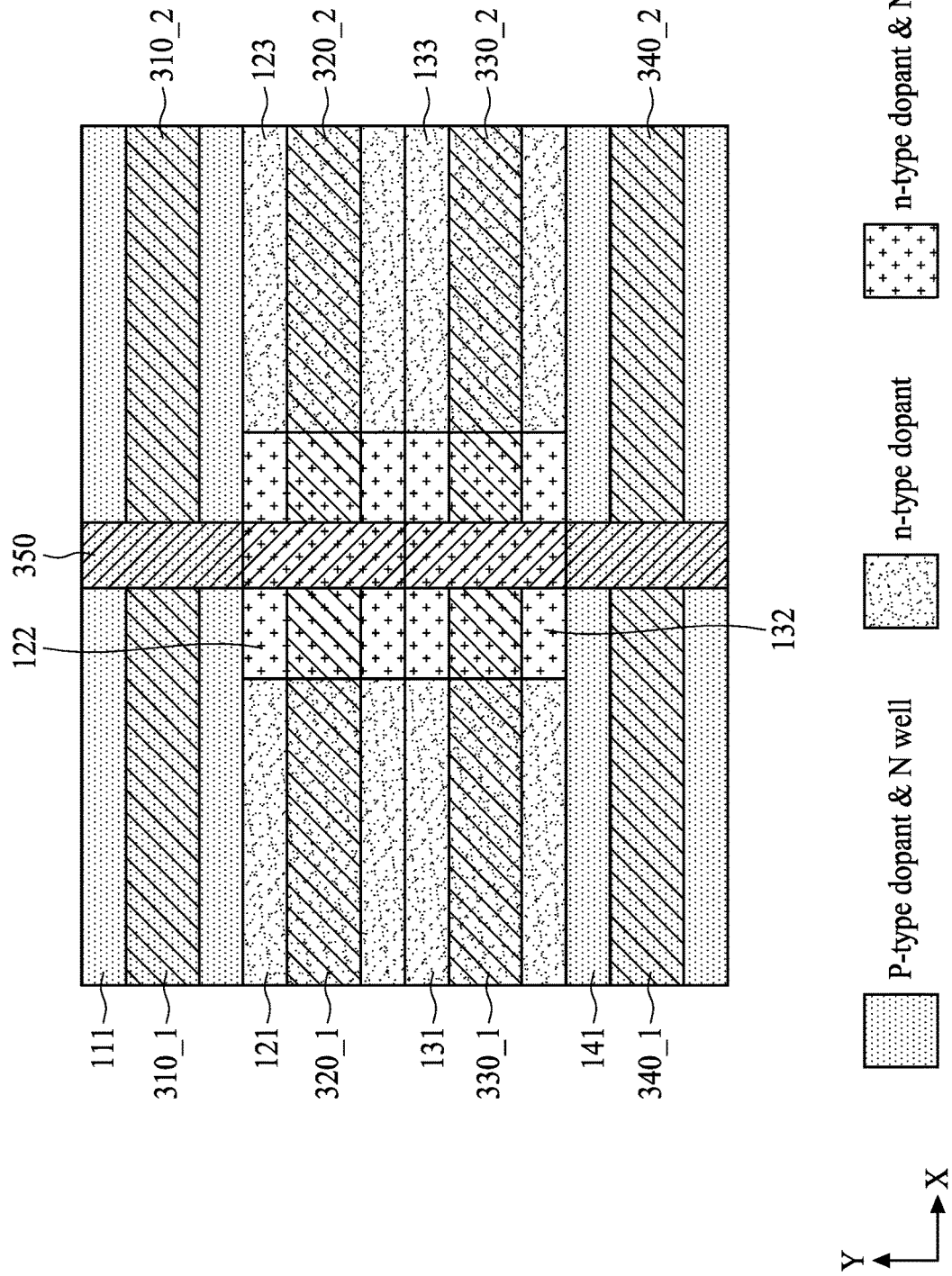
FIG. 4 is a diagram illustrating a cell in accordance with another embodiment of the present disclosure.

FIG. 4 is a diagram illustrating a cell 30 in accordance with an embodiment of the present disclosure. In this embodiment, the cell 30 is regarded as a cell that provides body terminals for the transistors formed around the cell 30. The cell 30 can be included in a semiconductor device which is not limited by the present disclosure.

The cell 30 is similar to the cell 10 except that a non-conductive strip 350 extending in y direction penetrates the cell. In an embodiment, refer to FIG. 4 in conjunction with FIG. 1, after the first OD strip 110, the second OD strip 120, the third OD strip 130, and the fourth OD strip 140 are formed, a cut-off operation is executed. Next, a filling operation is executed to fill a non-conductive material in the trench generated by the cut-off operation to generate the non-conductive strip 350 in FIG. 4. It should be noted that the processing of generating the non-conductive strip 350 is not a limitation of the present disclosure. In other embodiments, the non-conductive strip 350 is generated by different method.

The first OD strip 110 in FIG. 1 is separated as OD strips 310_1 and 310_2 in FIG. 4, and the doping region 111 is disposed on the OD strip 310_1 and 310_2. The second OD strip 120 in FIG. 1 is separated as OD strips 320_1 and 320_2 in FIG. 4, and the doping region 121, 122, and 123 are disposed on the OD strips 320_1 and 320_2. The third OD strip 130 in FIG. 1 is separated as OD strips 330_1 and 330_2 in FIG. 4, and the doping regions 131, 132, and 133 are disposed on the OD strips 330_1 and 330_2. The fourth OD strip 140 in FIG. 1 is separated as OD strips 340_1 and 340_2 in FIG. 4, and the doping region 141 is disposed on the OD strips 340_1 and 340_2.

Figure 5:
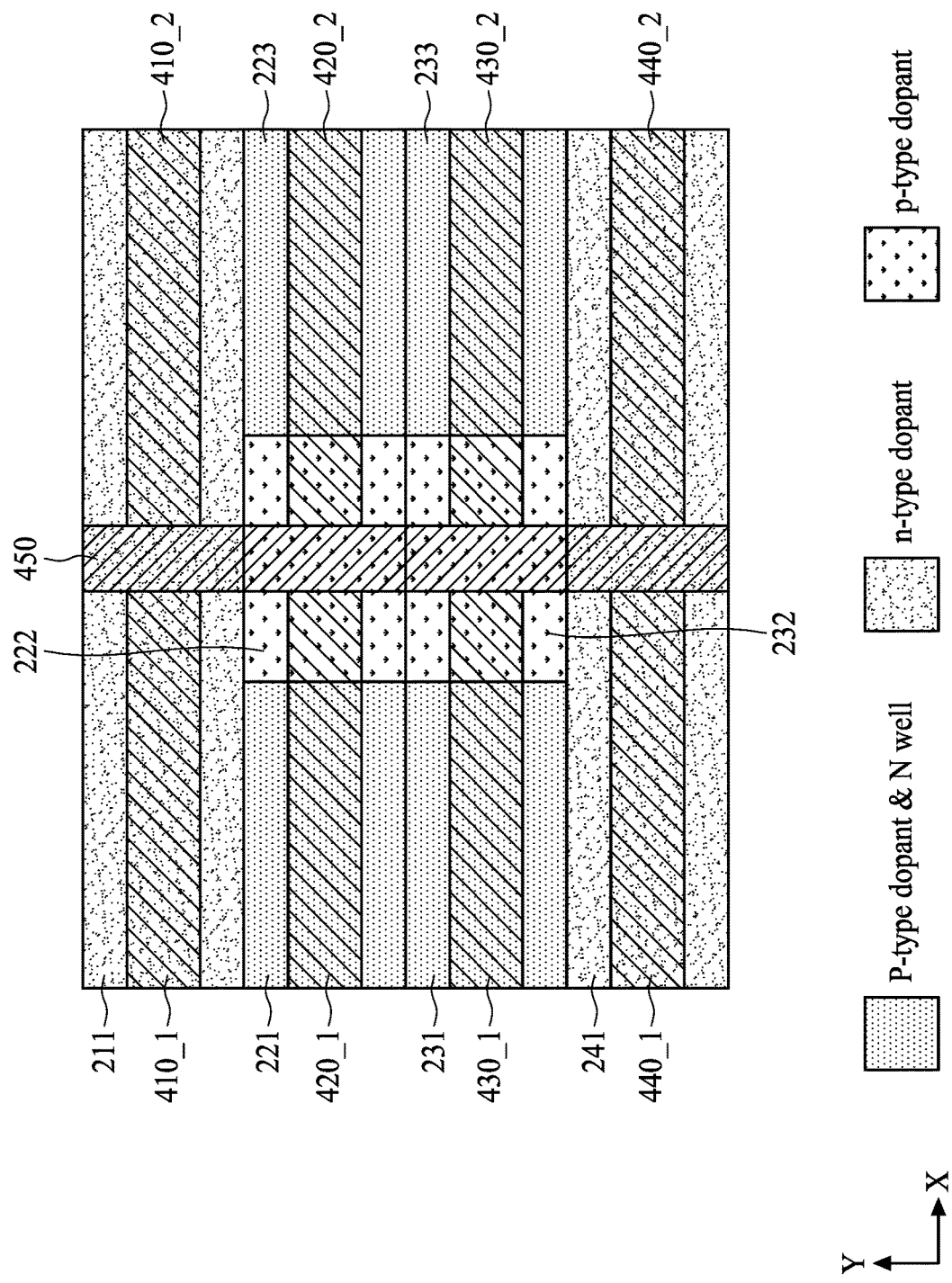
FIG. 5 is a diagram illustrating a cell in accordance with another embodiment of the present disclosure.

FIG. 5 is a diagram illustrating a cell 40 in accordance with an embodiment of the present disclosure. In this embodiment, the cell 40 is regarded as a cell that provides body terminals for the transistors formed around the cell 40. The cell 40 can be included in a semiconductor device which is not limited by the present disclosure.

The cell 40 is similar to the cell 20 except that a non-conductive strip 450 extending in y direction penetrates the cell. In an embodiment, refer to FIG. 5 in conjunction with FIG. 3, after the first OD strip 210, the second OD strip 220, the third OD strip 230, and the fourth OD strip 240 are formed, a cut-off operation is executed. Next, a filling operation is executed to fill a non-conductive material in the trench generated by the cut-off operation to generate the non-conductive strip 450 in FIG. 5. It should be noted that the processing of generating the non-conductive strip 450 is not a limitation of the present disclosure. In other embodiments, the non-conductive strip 450 is generated by different method.

The first OD strip 210 in FIG. 3 is separated as OD strips 410_1 and 410_2 in FIG. 5, and the doping region 211 is disposed on the OD strip 410_1 and 410_2. The second OD strip 220 in FIG. 3 is separated as OD strips 420_1 and 420_2 in FIG. 5, and the doping regions 221, 222 and 223 are disposed on the OD strips 420_1 and 420_2. The third OD strip 230 in FIG. 3 is separated as OD strips 430_1 and 430_2 in FIG. 5, and the doping regions 231, 232 and 233 are disposed on the OD strips 430_1 and 430_2. The fourth OD strip 240 in FIG. 3 is separated as OD strips 440_1 and 440_2 in FIG. 5, and the doping region 241 is disposed on the OD strips 440_1 and 440_2.

Figure 6:
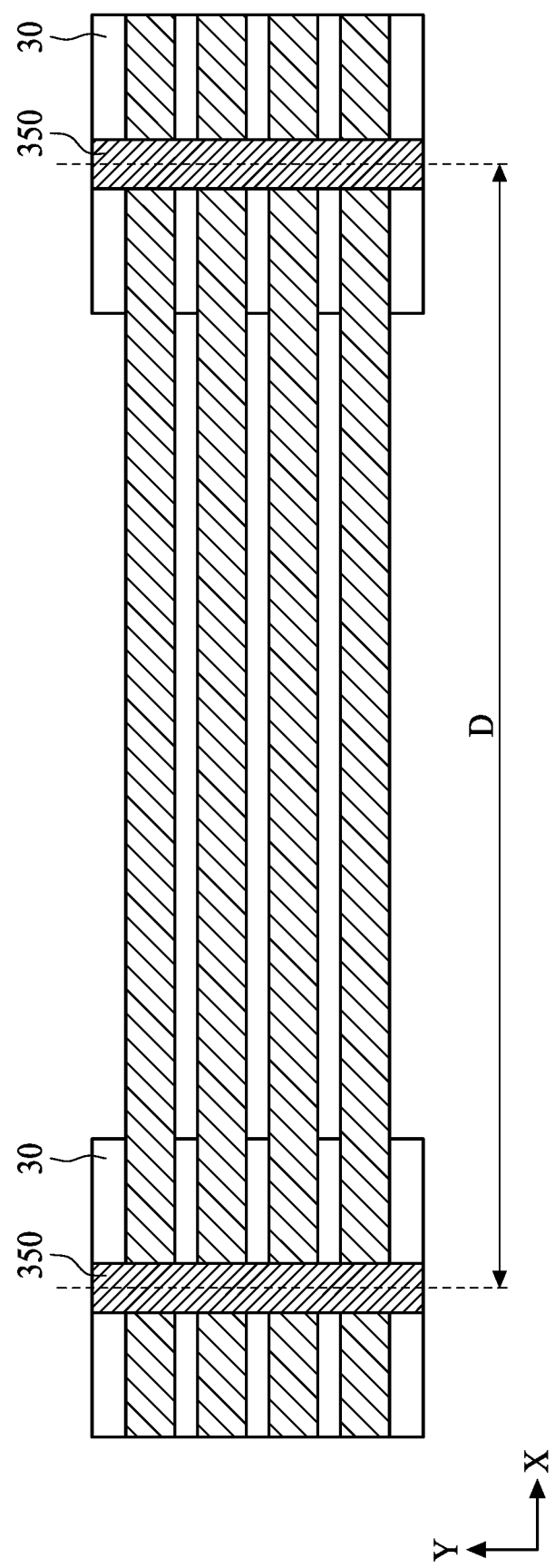
FIG. 6 is a diagram illustrating the distance between two non-conductive strips in accordance with an embodiment of the present disclosure.

It should be noted that the non-conductive strips 350 and 450 are configured to be a boundary which defines a maximum length of an OD strip in x direction. Refer to FIG. 6, taking the cell 30 for example, two cells 30 are arranged in x direction, wherein the distance D between the non-conductive strips 350 defines a maximum length of the OD strips that the process allows. In the embodiments of FIG. 4 and FIG. 5, the non-conductive strips 350 and 450 are located at the central axis of the cells 30 and 40, respectively. However, this is not a limitation of the present disclosure. It shall fall within the scope of the present disclosure as soon as the distance between two non-conductive strips define the maximum length of the OD strip.

Figure 7:
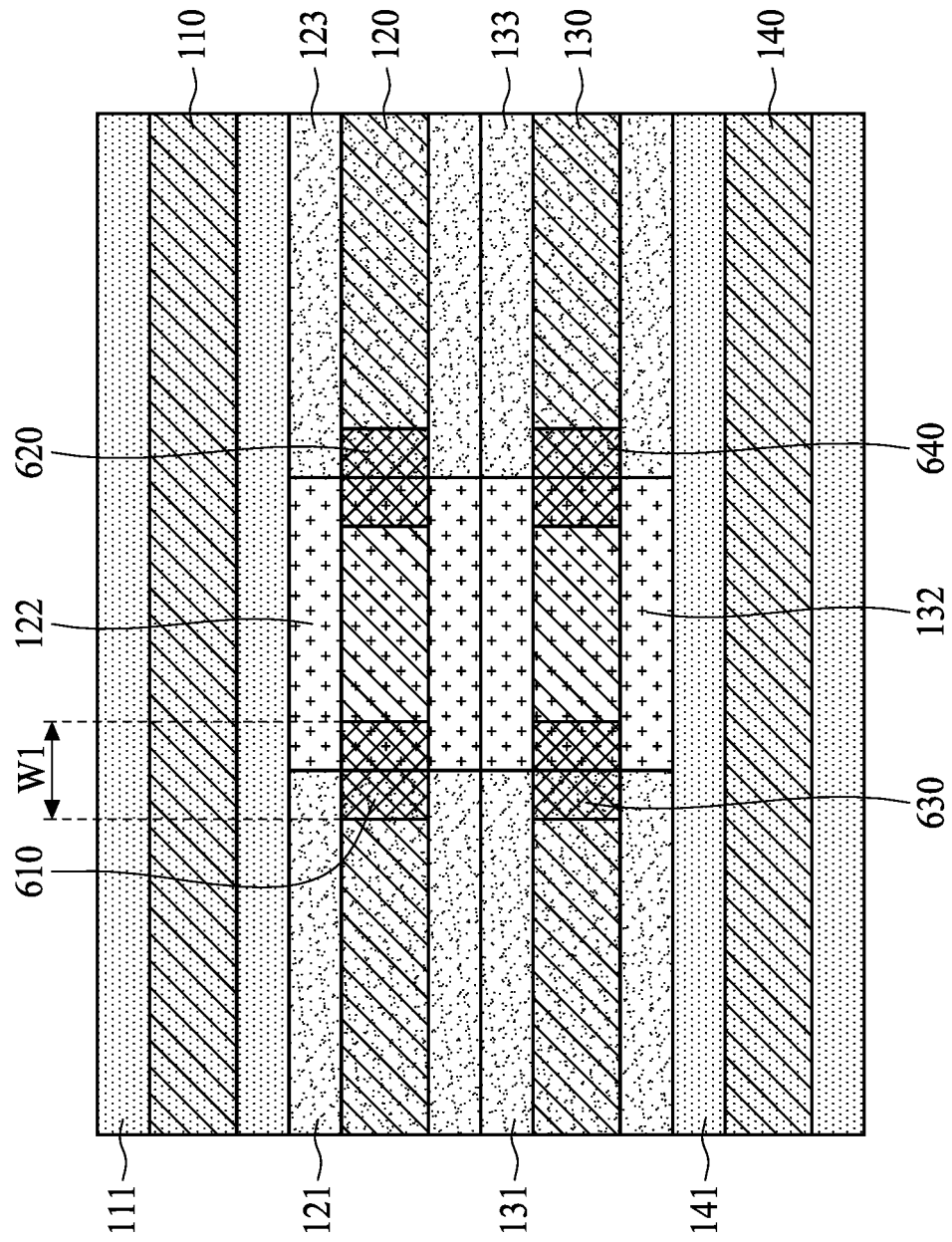
FIG. 7 is a diagram illustrating a cell in accordance with another embodiment of the present disclosure.

FIG. 7 is a diagram illustrating a cell 10' in accordance with an embodiment of the present disclosure. In this embodiment, the cell 10' is regarded as a cell that provides body terminals for the transistors formed around the cell 10'. The cell 10' can be included in a semiconductor device which is not limited by the present disclosure.

The cell 10' is similar to the cell 10 except that the cell 10' further includes the dummy OD strips 610, 620, 630 and 640. In an embodiment, the second OD strip 120 includes a dummy OD strip 610 which is formed at the boundary between the doping regions 121 and 122. The second OD strip 120 further includes a dummy OD strip 620 which is formed at the boundary between the doping regions 122 and 123. In addition, the edges of the doping region 122 are formed on the dummy OD strips 610 and 620, respectively.

Likewise, the third OD strip 130 includes a dummy OD strip 630 which is formed at the boundary between the doping regions 131 and 132. The third strip 130 further includes a dummy OD strip 640 formed at the boundary between the doping regions 132 and 133. In addition, the edges of the doping region 132 are formed on the dummy OD strip 630 and 640, respectively. The dummy OD strips 610 and 620 are electrically isolated from the second OD strip 120, and the dummy OD strips 630 and 640 are electrically isolated from the third OD strip 130.

In some embodiments, the width W1 of the dummy OD strips 610, 620, 630 and 640 is 1 pitch long, wherein a pitch is defined as the distance between two adjacent poly gates. In some embodiment, the width W1 is 2 pitches long, and in other embodiments, the width W1 is 3 pitches long. In some embodiments, the width of the dummy OD strip 610, 620, 630 and 640 are not required to be the same.

Figure 8:
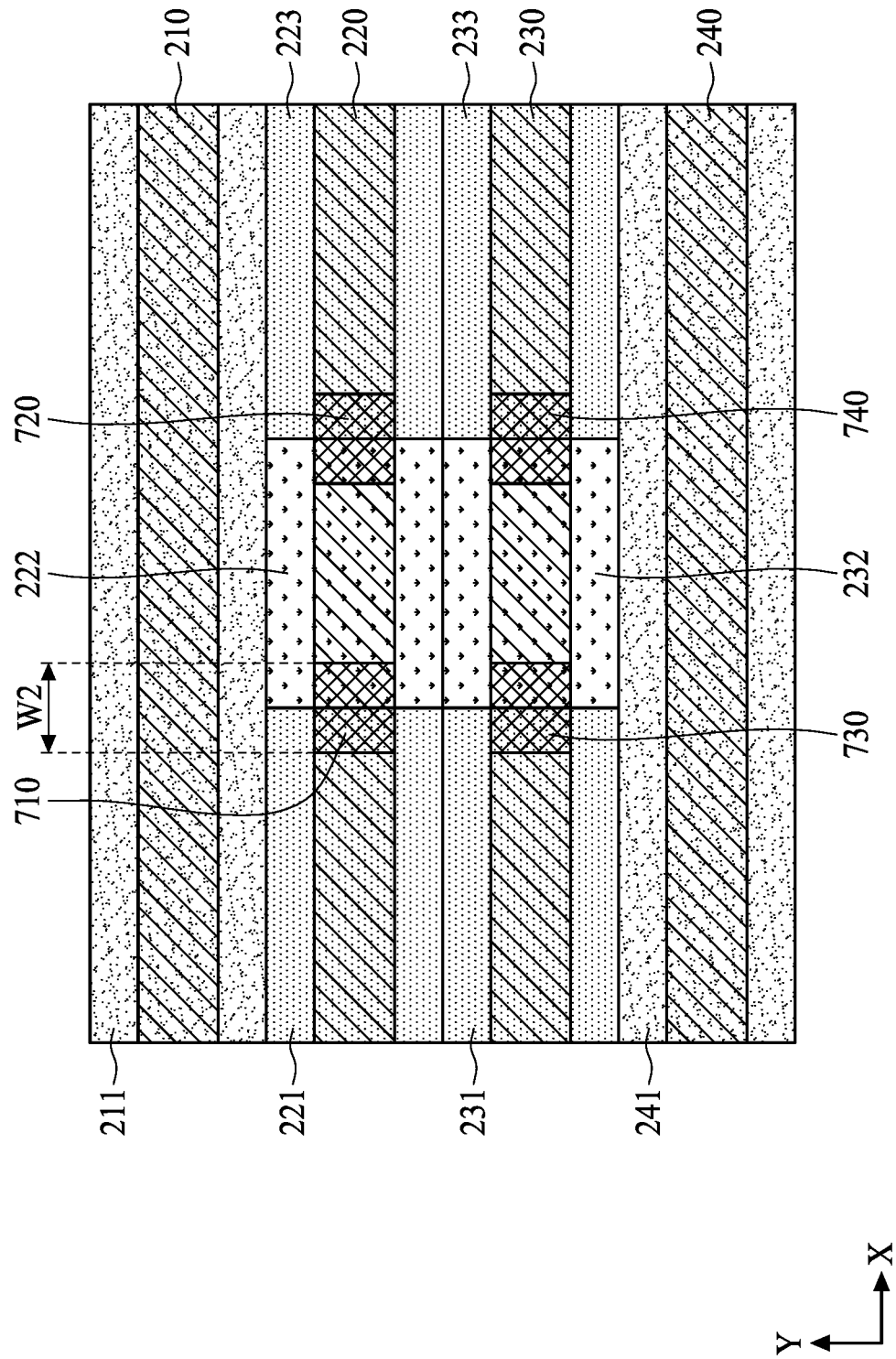
FIG. 8 is a diagram illustrating a cell in accordance with another embodiment of the present disclosure.

FIG. 8 is a diagram illustrating a cell 20' in accordance with an embodiment of the present disclosure. In this embodiment, the cell 20' is regarded as a cell that provides body terminals for the transistors formed around the cell 20'. The cell 20' can be included in a semiconductor device which is not limited by the present disclosure.

The cell 20' is similar to the cell 20 except that the cell 20' further includes the dummy OD strips 710, 720, 730 and 740. In an embodiment, the second OD strip 220 includes a dummy OD strip 710 which is formed at the boundary between the doping regions 221 and 222. The second OD strip 220 further includes a dummy OD strip 720 which is formed at the boundary between the doping regions 222 and 223. In addition, the edges of the doping region 222 are formed on the dummy OD strips 710 and 720, respectively.

Likewise, the third OD strip 230 includes a dummy OD strip 730 which is formed at the boundary between the doping regions 231 and 232. The third strip 230 further includes a dummy OD strip 740 formed at the boundary between the doping regions 232 and 233. In addition, the edges of the doping region 232 are formed on the dummy OD strips 730 and 740, respectively. The dummy OD strips 710 and 720 are electrically isolated from the second OD strip 220, and the dummy OD strips 730 and 740 are electrically isolated from the third OD strip 230.

In some embodiments, the width W2 of the dummy OD strips 710, 720, 730 and 740 is 1 pitch long, wherein a pitch is defined as the distance between two adjacent poly gates. In some embodiment, the width W2 is 2 pitches long, and in other embodiments, the width W2 is 3 pitches long. In some embodiments, the width of the dummy OD strip 710, 720, 730 and 740 are not required to be the same.

Figure 9:
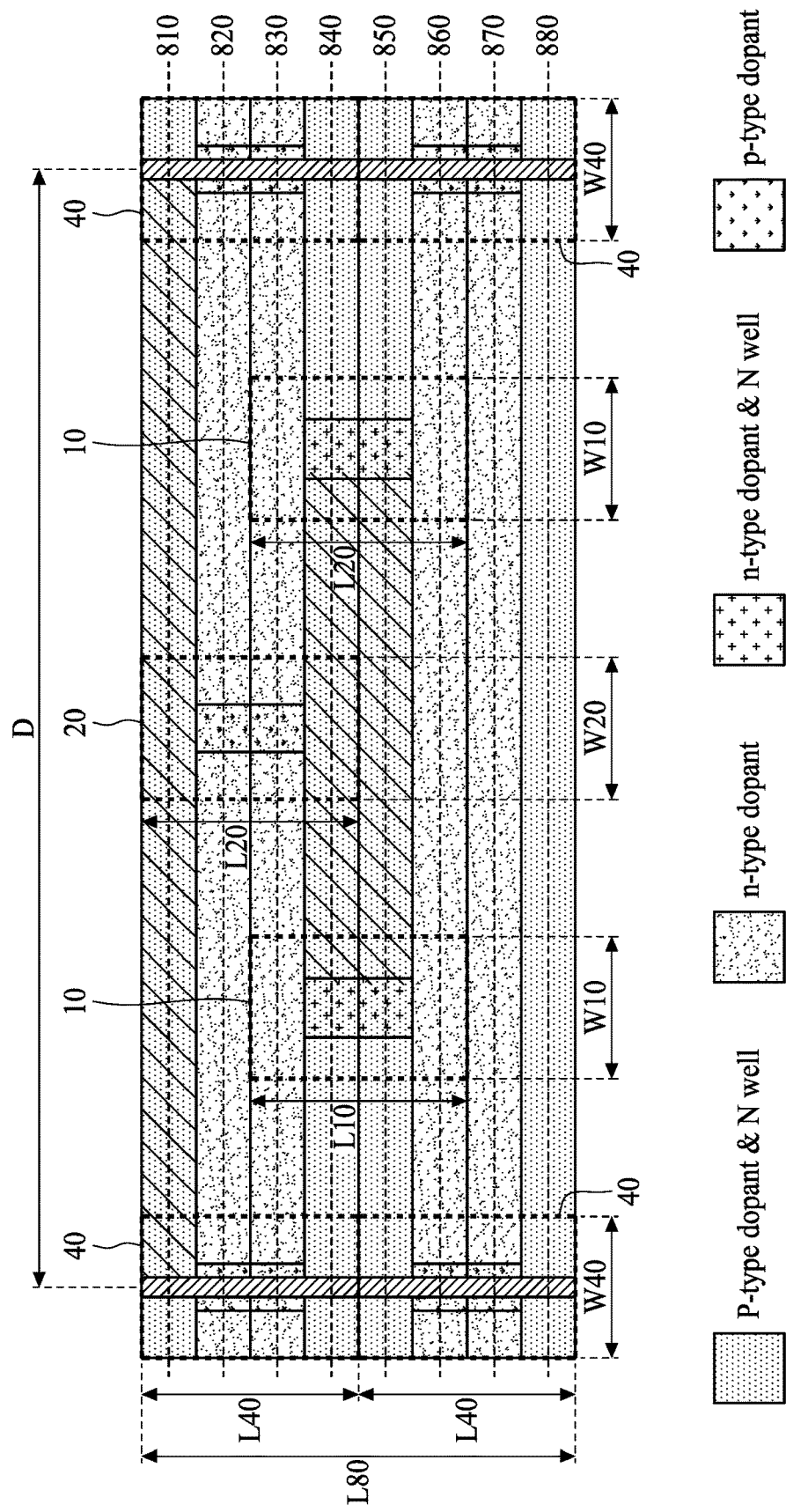
FIG. 9 is a diagram illustrating a floor plan in accordance with an embodiment of the present disclosure.

FIG. 9 is a diagram illustrating a floor plan 80 in accordance with an embodiment of the present disclosure. In this embodiment, the floor plan 80 is adapted by a semiconductor device. The floor plan 80 includes OD strips 810, 820, 830, 840, 850, 860, 870, and 880 arranged in y direction. The OD strips 810, 840, 850 and 880 define the active region (e.g., the source terminal or the drain terminal) of NMOS. The OD strips 820, 830, 860 and 870 define the active region (e.g., the source terminal or the drain terminal) of PMOS.

In floor plan 80, the cell 20 is formed on the OD strips 810, 820, 830 and 840. Furthermore, the two cells 10 are formed on the OD strips 830, 840, 850 and 860. In addition, the four cells 40 are formed at the both ends of the OD strips 810-880, wherein the distance D between the non-conductive strips is the maximum length of the OD strip that the process allows.

In this embodiment, the cell 20 is located on the central axis of the cells 10. Moreover, the cell 10 on the left hand side is located on the central axis of the cell 40 at the top left corner and the cell 20. Furthermore, the cell 10 on the right hand side is located on the central axis of the cell 40 at the top right corner and the cell 20.

Figure 10A:
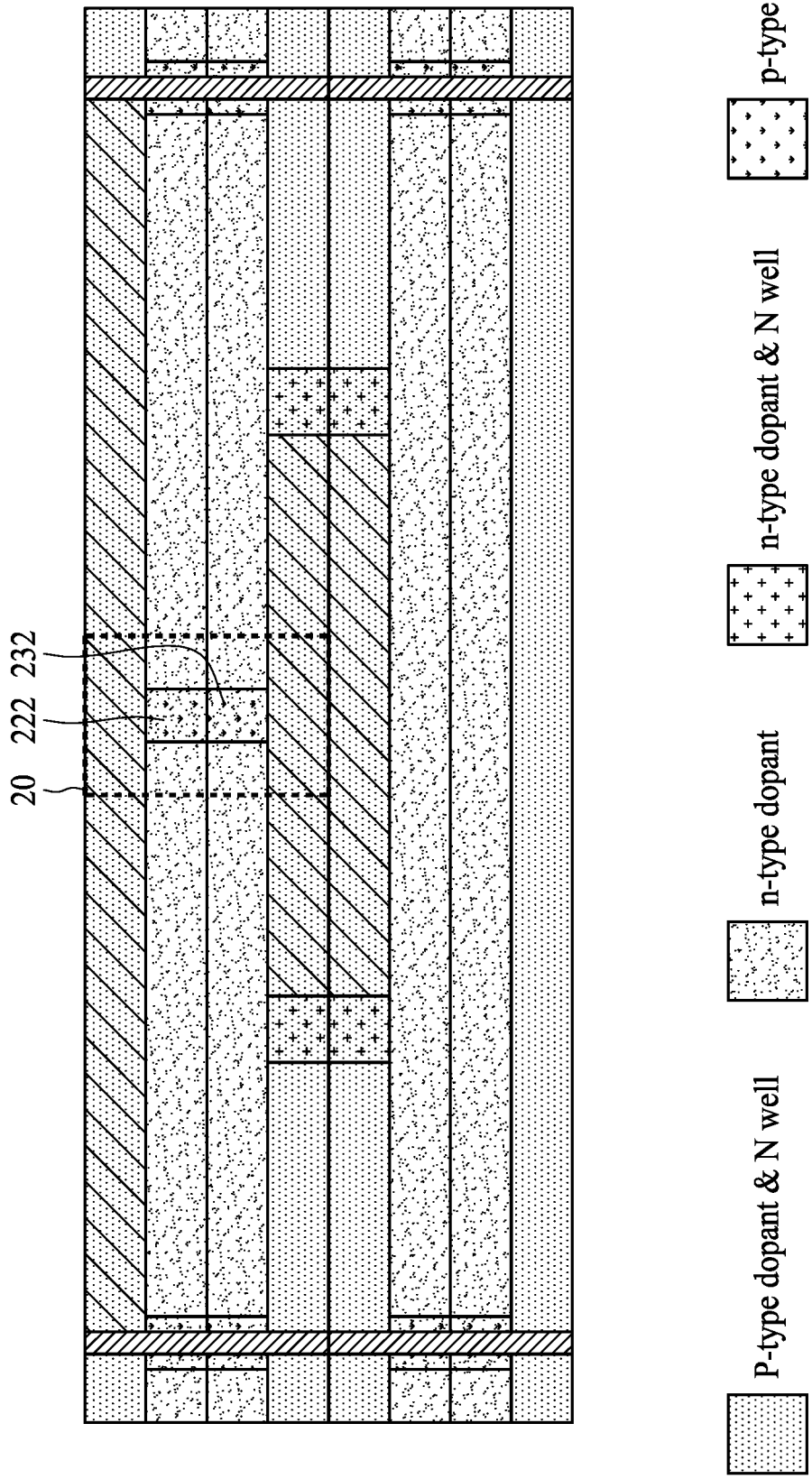
FIG. 10A is a diagram illustrating a work scope of a cell 20 in the floor plan 80 in accordance with an embodiment of the present disclosure.

As mentioned above, the cell 20 is configured to be a body terminal of NMOS around the cell 20. Refer to FIG. 10A in conjunction with FIG. 9, the cell 20 in the floor plan 80 is configured to be a body terminal of NMOS formed in the area marked by slash line. In an embodiment, the doping region 222 is configured to be a body terminal of NMOS formed in the area marked by the slash line on the OD strip 810, and the doping region 232 is configured to be a body terminal of NMOS formed in the area marked by the slash line on the OD strips 840 and 850.

Figure 10B:
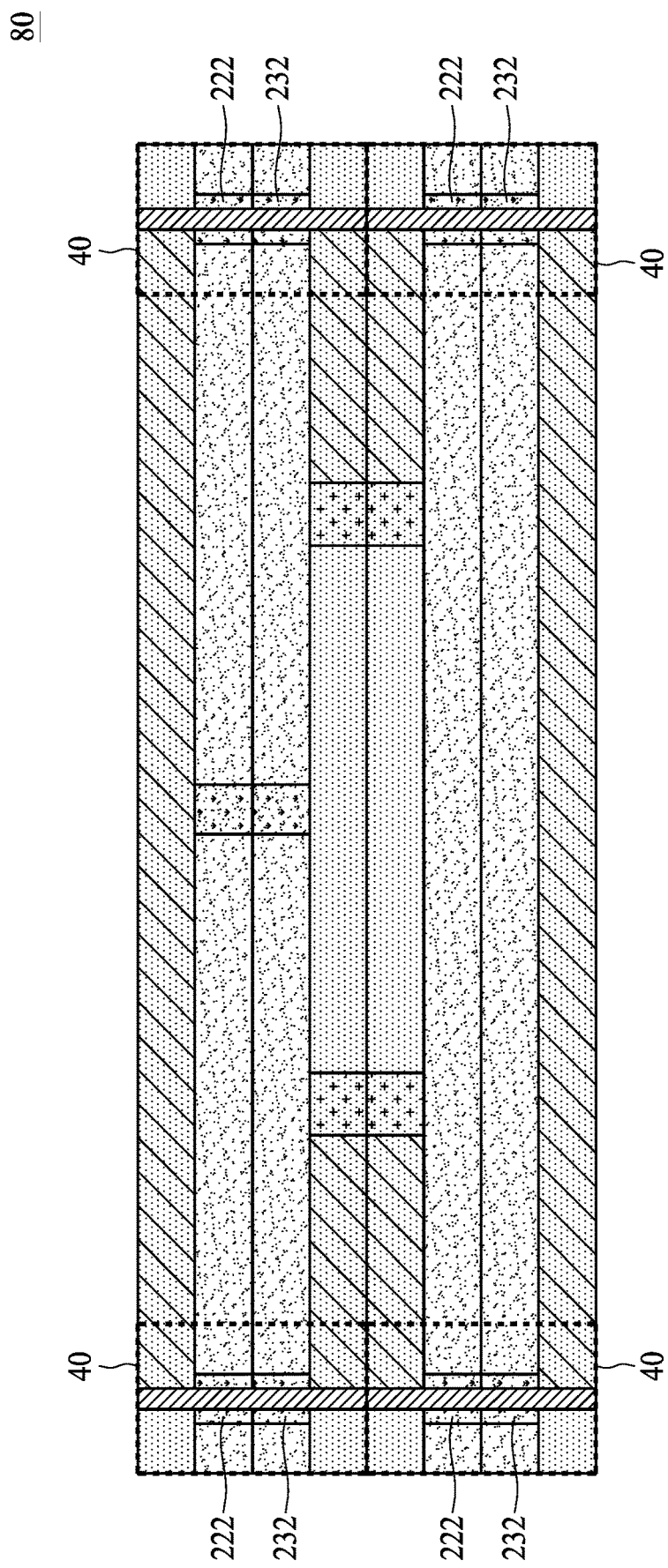
FIG. 10B is a diagram illustrating a work scope of a cell 10 in the floor plan 80 in accordance with an embodiment of the present disclosure.

As mentioned above, the cell 40 is configured to be a body terminal of NMOS around the cell 40. Refer to FIG. 10B in conjunction with FIG. 9, the cell 40 in the floor plan 80 is configured to be a body terminal of NMOS formed in the area marked by slash line. In an embodiment, the doping region 222 of the cell 40 at the top left corner and the doping region 222 of the cell 40 at the top right corner are configured to be body terminals of NMOS formed in the area marked by the slash line on the OD strip 810. Moreover, the doping region 232 of the cell 40 at the top left corner and the doping region 222 of the cell 40 at the bottom left corner are configured to be body terminals of NMOS formed in the area marked by the slash line on the OD strips 840 and 850 on the left hand side. Furthermore, the doping region 232 of the cell 40 at the top right corner and the doping region 222 of the cell 40 at the bottom right corner are configured to be body terminals of NMOS formed in the area marked by the slash line on the OD strips 840 and 850 on the right hand side. In addition, the doping region 232 of the cell 40 at the bottom left corner and the doping region 232 of the cell at the bottom right corner are configured to be body terminals of NMOS formed in the area marked by the slash line on the OD strip 880.

Figure 10C:
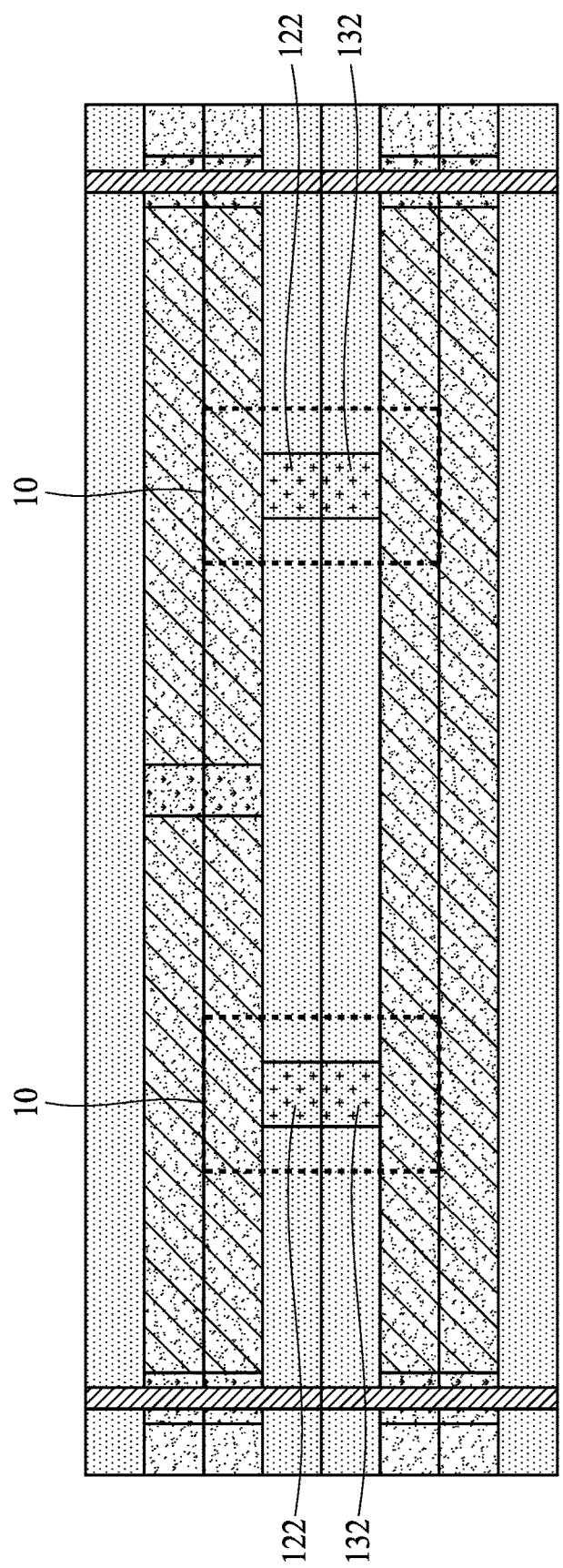
FIG. 10C is a diagram illustrating a work scope of a cell 40 in the floor plan 80 in accordance with an embodiment of the present disclosure.

As mentioned above, the cell 10 is configured to be a body terminal of PMOS around the cell 10. Refer to FIG. 10C in conjunction with FIG. 9, the cell 10 in the floor plan 80 is configured to be a body terminal of PMOS formed in the area marked by slash line. In an embodiment, the doping region 122 of the cell 10 on the left hand side and the doping region 122 of the cell 10 on the right hand side are configured to be body terminals of PMOS formed in the area marked by the slash line on the OD strips 820 and 830. The doping region 132 of the cell 10 on the left hand side and the doping region 132 of the cell 10 on the right hand side are configured to be body terminals of PMOS formed in the area marked by the slash line on the OD strips 860 and 870.

Refer to FIG. 9 again, in this embodiment, the width of the cell 20 is W20 while the length of the cell 20 is L20, wherein the length L20 is half of the length L80 of the floor plan 80. Therefore, the percentage of the cell 20 occupying the floor plan 80 is (W20*L20)/(D*2L20)=W20/2D. In some embodiments, the width W20 is D/8. Hence, the percentage of the cell 20 occupying the floor plan 80 is 1/16=6.25%.

Moreover, the width of the cell 10 is W10 while the length of the cell 10 is L10, wherein the length L10 is half of the length L80 of the floor plan 80. Therefore, the percentage of the two cells 10 occupying the floor plan 80 is 2*(W10*L10)/(D*2L10)=W10/D. In some embodiments, the width W10 is D/8. Hence, the percentage of the cell 10 occupying the floor plan 80 is 1/8=12.5%.

Furthermore, the width of the cell 40 is W40 while the length of the cell 40 is L40, wherein the length L40 is half of the length L80 of the floor plan 80, and only a half of each cell 40 is counted. Therefore, the percentage of the four cells 40 occupying the floor plan 80 is 4*(0.5*W40*L40)/(D*2L40)=W40/D. In some embodiments, the width W40 is D/8. Hence, the percentage of the cell 40 occupying the floor plan 80 is 1/8=12.5%.

Figure 11:
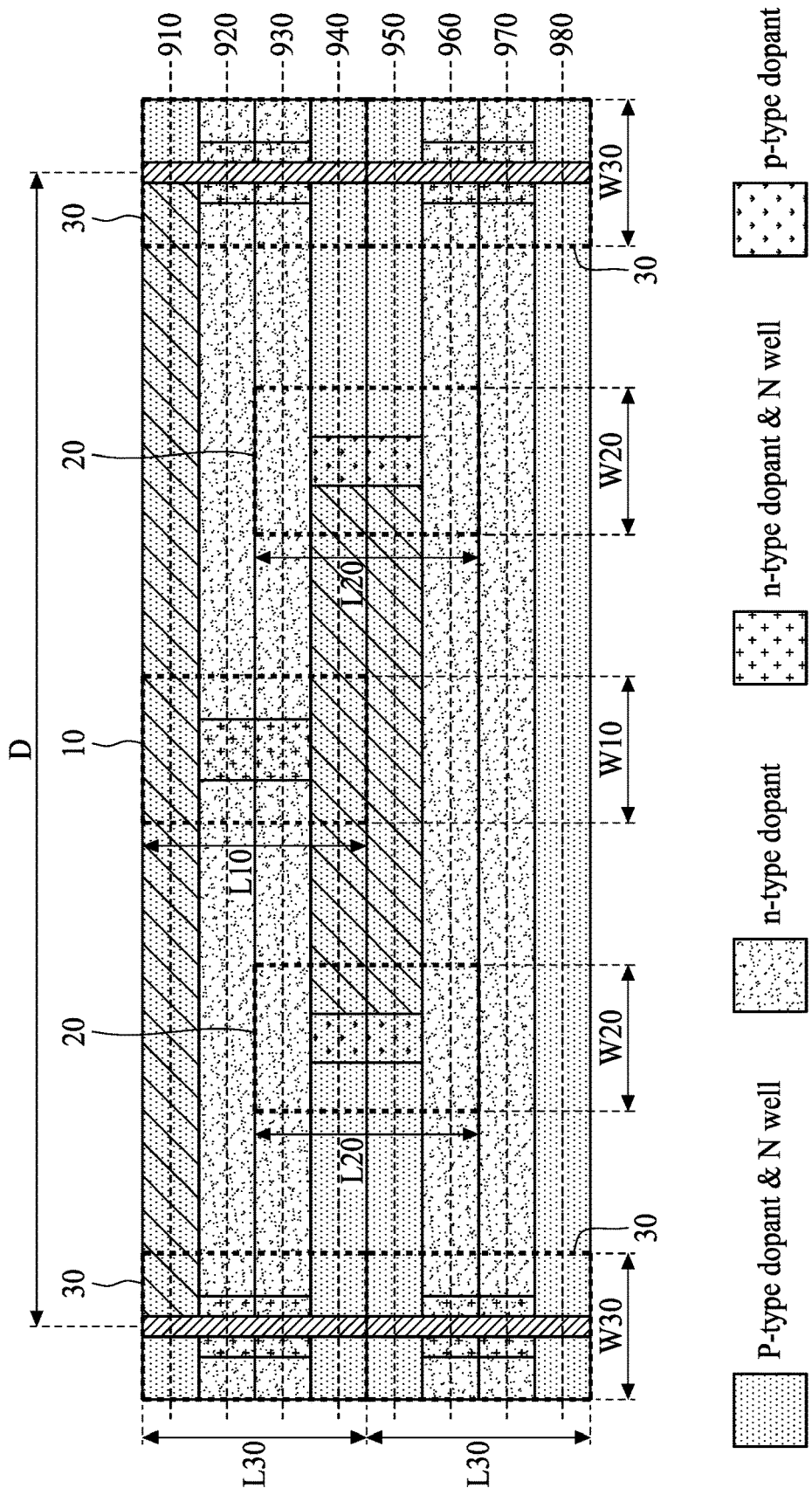
FIG. 11 is a diagram illustrating a floor plan in accordance with another embodiment of the present disclosure.

FIG. 11 is a diagram illustrating a floor plan 90 in accordance with an embodiment of the present disclosure. In this embodiment, the floor plan 90 is adapted by a semiconductor device. The floor plan 90 includes OD strips 910, 920, 930, 940, 950, 960, 970, and 980 arranged in y direction. The OD strips 910, 940, 950 and 980 define the active region (e.g., the source terminal or the drain terminal) of PMOS. The OD strips 920, 930, 960 and 970 define the active region (e.g., the source terminal or the drain terminal) of NMOS.

In floor plan 90, the cell 10 is formed on the OD strips 910, 920, 930 and 940. Furthermore, the two cells 20 are formed on the OD strips 930, 940, 950 and 960. In addition, the four cells 30 are formed at the both ends of the OD strips 910-980, wherein the distance D between the non-conductive strips is the maximum length of the OD strip that the process allows.

In this embodiment, the cell 10 is located on the central axis of the cells 20. Moreover, the cell 20 on the left hand side is located on the central axis of the cell 30 at the top left corner and the cell 10. Furthermore, the cell 20 on the right hand side is located on the central axis of the cell 30 at the top right corner and the cell 10.

Figure 12A:
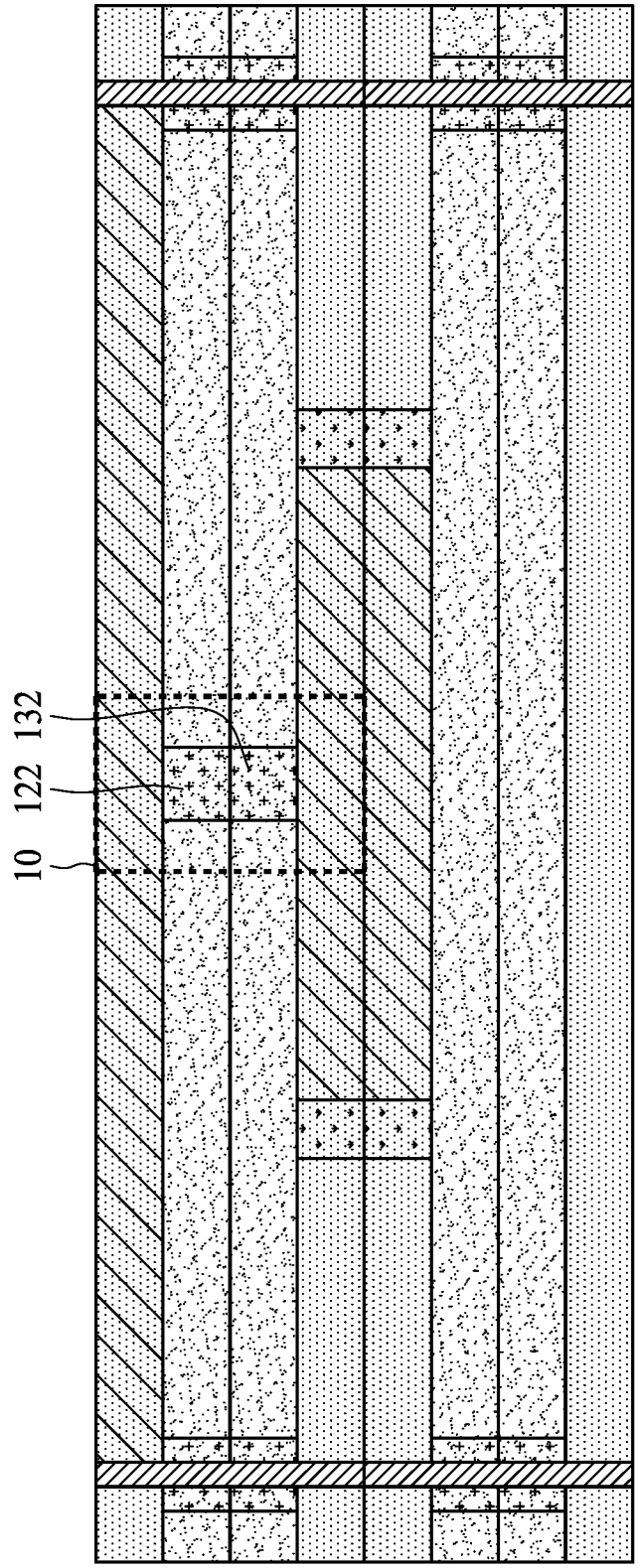
FIG. 12A is a diagram illustrating a work scope of a cell 10 in the floor plan 90 in accordance with an embodiment of the present disclosure.

As mentioned above, the cell 10 is configured to be a body terminal of PMOS around the cell 10. Refer to FIG. 12A in conjunction with FIG. 11, the cell 10 in the floor plan 90 is configured to be a body terminal of PMOS formed in the area marked by slash line. In an embodiment, the doping region 122 is configured to be a body terminal of PMOS formed in the area marked by the slash line on the OD strip 910, and the doping region 132 is configured to be a body terminal of PMOS formed in the area marked by the slash line on the OD strips 940 and 950.

Figure 12B:
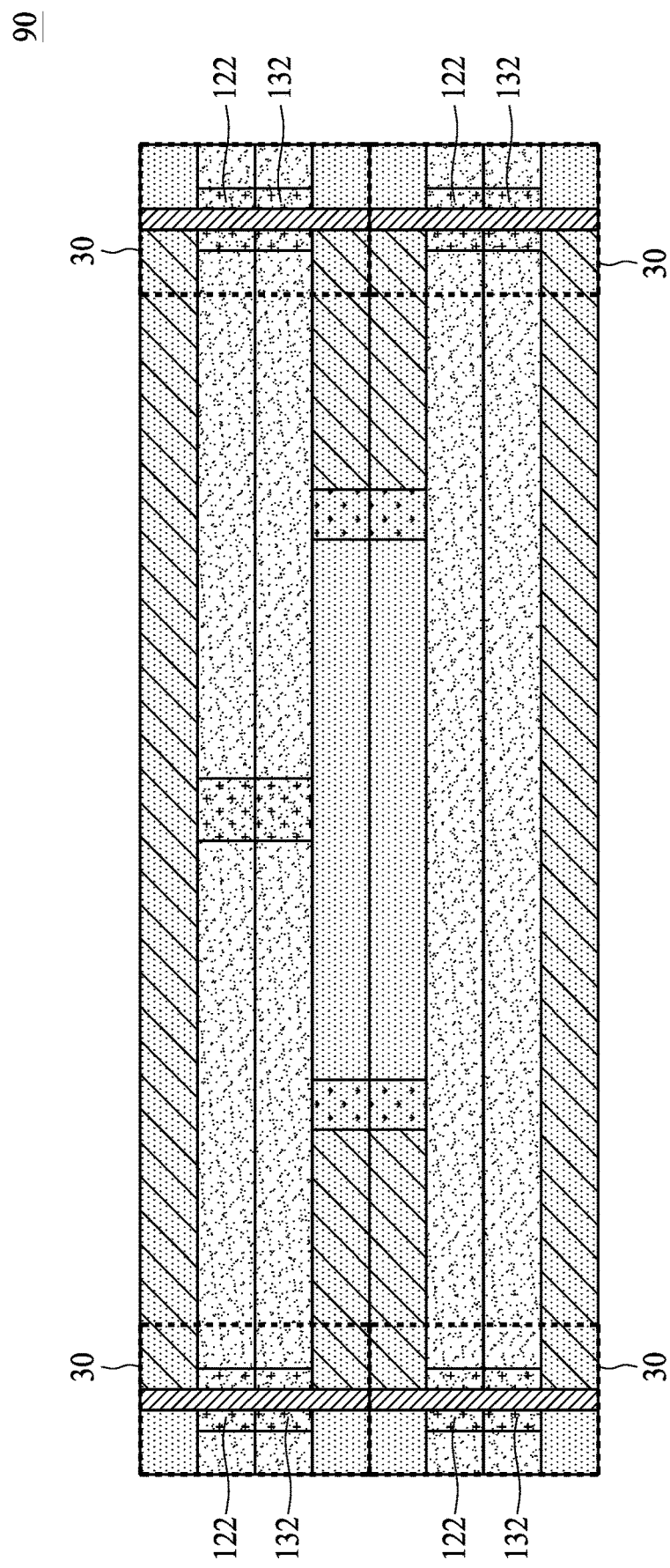
FIG. 12B is a diagram illustrating a work scope of a cell 20 in the floor plan 90 in accordance with an embodiment of the present disclosure.

As mentioned above, the cell 30 is configured to be a body terminal of PMOS around the cell 30. Refer to FIG. 12B in conjunction with FIG. 11, the cell 30 in the floor plan 90 is configured to be a body terminal of PMOS formed in the area marked by slash line. In an embodiment, the doping region 122 of the cell 30 at the top left corner and the doping region 122 of the cell 30 at the top right corner are configured to be body terminals of PMOS formed in the area marked by the slash line on the OD strip 910. Moreover, the doping region 132 of the cell 30 at the top left corner and the doping region 122 of the cell 30 at the bottom left corner are configured to be body terminals of PMOS formed in the area marked by the slash line on the OD strips 940 and 950 on the left hand side. Furthermore, the doping region 132 of the cell 30 at the top right corner and the doping region 122 of the cell 30 at the bottom right corner are configured to be body terminals of PMOS formed in the area marked by the slash line on the OD strips 940 and 950 on the right hand side. In addition, the doping region 132 of the cell 30 at the bottom left corner and the doping region 132 of the cell at the bottom right corner are configured to be body terminals of PMOS formed in the area marked by the slash line on the OD strip 980.

Figure 12C:
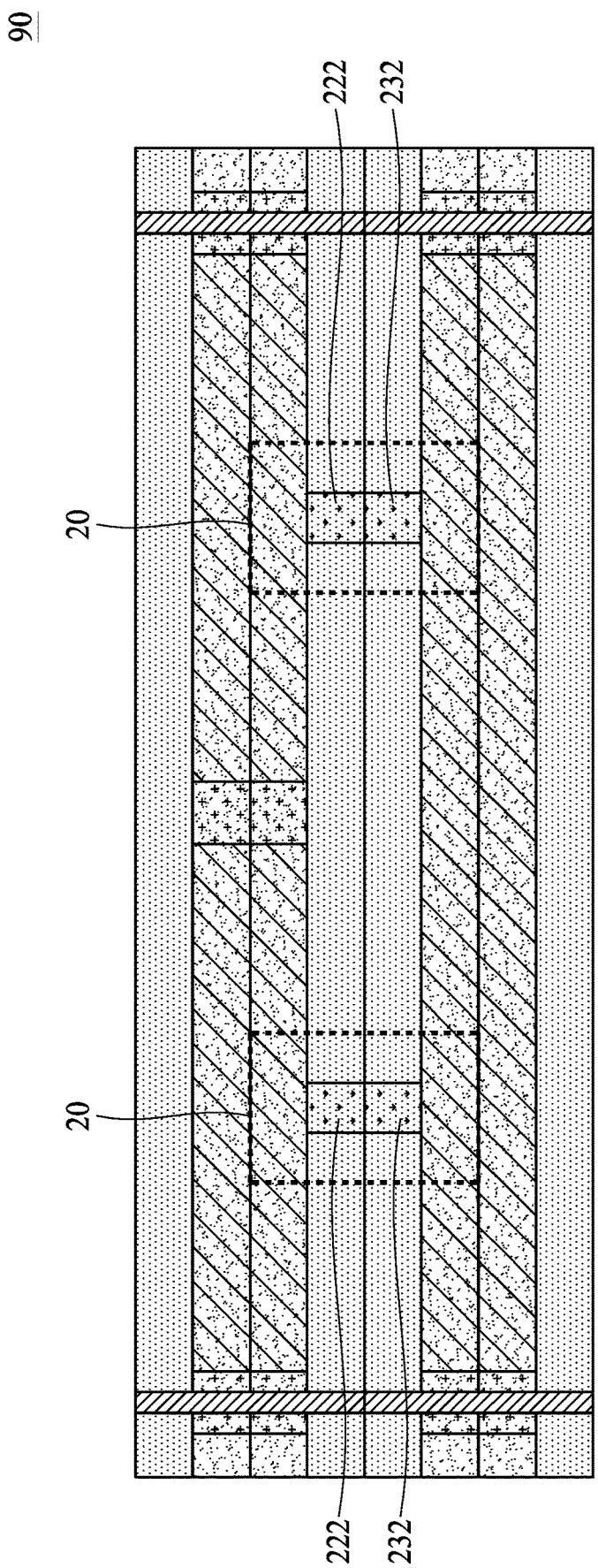
FIG. 12C is a diagram illustrating a work scope of a cell 30 in the floor plan 90 in accordance with an embodiment of the present disclosure.

As mentioned above, the cell 20 is configured to be a body terminal of NMOS around the cell 20. Refer to FIG. 12C in conjunction with FIG. 11, the cell 20 in the floor plan 90 is configured to be a body terminal of NMOS formed in the area marked by slash line. In an embodiment, the doping region 222 of the cell 20 on the left hand side and the doping region 222 of the cell 20 on the right hand side are configured to be body terminals of NMOS formed in the area marked by the slash line on the OD strips 920 and 930. The doping region 232 of the cell 20 on the left hand side and the doping region 232 of the cell 20 on the right hand side are configured to be body terminals of NMOS formed in the area marked by the slash line on the OD strips 960 and 970.

Refer to FIG. 11 again, in this embodiment, the width of the cell 10 is W10 while the length of the cell 10 is L10, wherein the length L10 is half of the length L90 of the floor plan 90. Therefore, the percentage of the cell 10 occupying the floor plan 90 is (W10*L10)/(D*2L10)=W10/2D. In some embodiments, the width W10 is D/8. Hence, the percentage of the cell 10 occupying the floor plan 90 is $1/16$=6.25%.

Moreover, the width of the cell 20 is W20 while the length of the cell 20 is L20, wherein the length L20 is half of the length L90 of the floor plan 90. Therefore, the percentage of the two cells 20 occupying the floor plan 90 is 2*(W20*L20)/(D*2L20)=W20/D. In some embodiments, the width W20 is D/8. Hence, the percentage of the cell 20 occupying the floor plan 90 is $1/8$=12.5%.

Furthermore, the width of the cell 30 is W30 while the length of the cell 30 is L30, wherein the length L30 is half of the length L90 of the floor plan 90, and only a half of each cell 30 is counted. Therefore, the percentage of the four cells 30 occupying the floor plan 90 is 4*(0.5*W30*L30)/(D*2L30)=W30/D. In some embodiments, the width W30 is D/8. Hence, the percentage of the cell 30 occupying the floor plan 90 is $1/8$=12.5%.

In the embodiment of FIG. 9, the four cells 40 are disposed at the corners of the floor plan 80, wherein the distance D between the non-conductive strips 450 is the maximum length of the OD strip that the process allows. However, according to different processes, the distance D may not be the same. Therefore, the four corners of the floor plan 80 are not required to be occupied by the cell 40.

Figure 13:
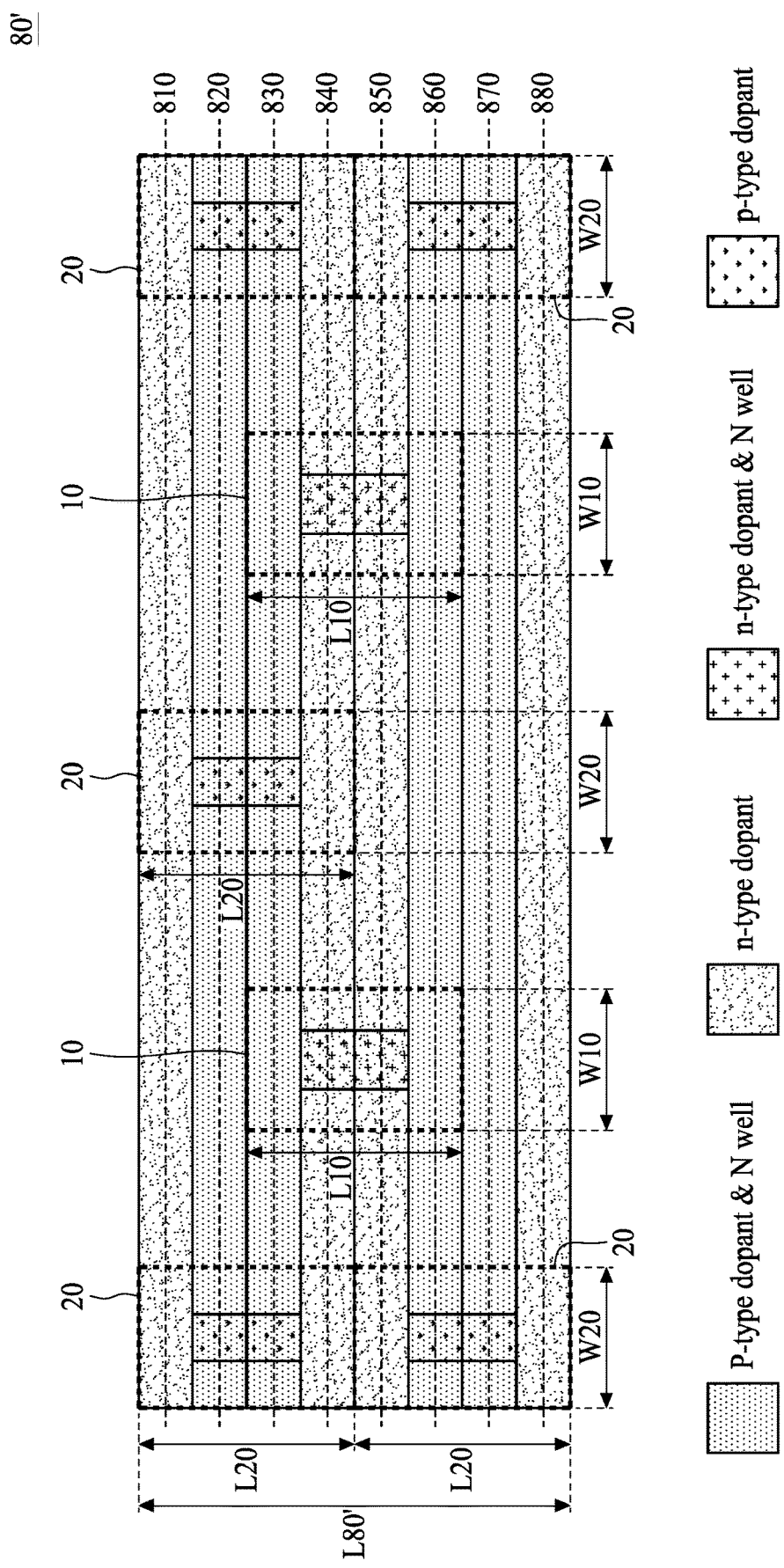
FIG. 13 is a diagram illustrating a floor plan in accordance with another embodiment of the present disclosure.

FIG. 13 is a diagram illustrating a floor plan 80' in accordance with another embodiment of the present disclosure. As shown in FIG. 13, the floor plan 80' is similar to the floor plan 80 in FIG. 9 except that the four corners of the floor plan 80' are occupied by the cell 20. Those skilled in the art should readily understand the detail of the floor plan 80' after reading the embodiment of FIG. 9. The detailed description of the floor plan 80' is omitted here for brevity.

In the embodiment of FIG. 11, the four cells 30 are disposed at the corners of the floor plan 90, wherein the distance D between the non-conductive strips 350 is the maximum length of the OD strip that the process allows. However, according to different processes, the distance D may not be the same. Therefore, the four corners of the floor plan 90 are not required to be occupied by the cell 30.

Figure 14:
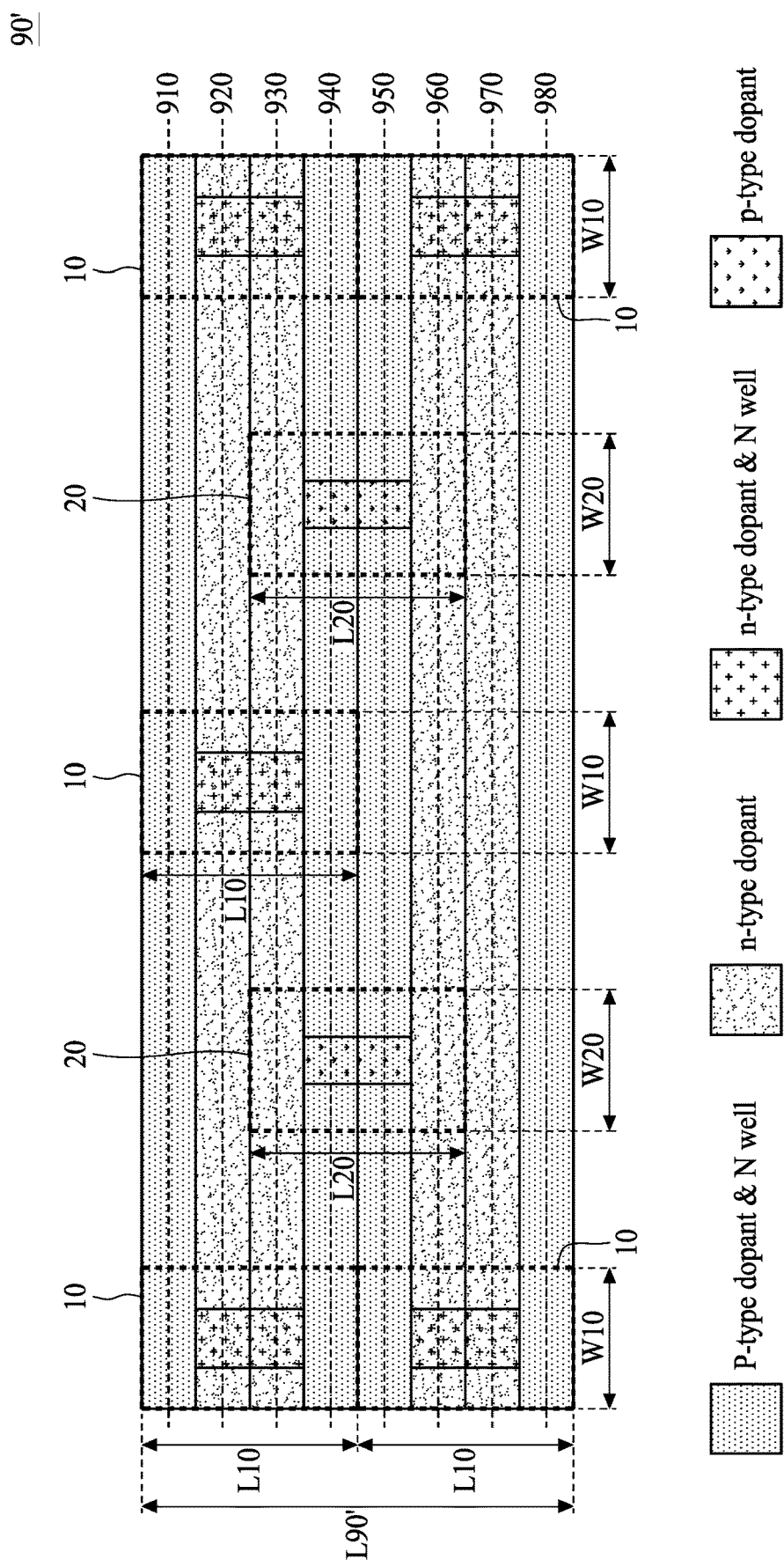
FIG. 14 is a diagram illustrating a floor plan in accordance with another embodiment of the present disclosure.

FIG. 14 is a diagram illustrating a floor plan 90' in accordance with another embodiment of the present disclosure. As shown in FIG. 14, the floor plan 90' is similar to the floor plan 90 in FIG. 11 except that the four corners of the floor plan 90' are occupied by the cell 10. Those skilled in the art should readily understand the detail of the floor plan 90' after reading the embodiment of FIG. 11. The detailed description of the floor plan 90' is omitted here for brevity.

In some embodiments, a semiconductor device is disclosed, including: a first OD strip, a first doping region, a second OD strip, a second doping region, and a third doping region. The first OD strip extends in a first direction. The first doping region is disposed on the first OD strip, wherein the first doping region includes a first-type dopant to define an active region of a first MOS. The second OD strip extends in the first direction and immediately adjacent to the first OD strip in a second direction, wherein the second direction is orthogonal with the first direction. The second doping region is disposed on the second OD strip, wherein the second doping region includes a second-type dopant to define an active region of a second MOS. The third doping region is disposed on the second OD strip, wherein the third doping region includes the second-type dopant and is configured to be a body terminal of the first MOS.

In some embodiments, a semiconductor device is disclosed, including: a first OD strip, a second OD strip, a first doping region, a second doping region, and a third doping region. The first OD strip extends in a first direction, wherein the first OD strip defines active region of first-type MOS. The second OD strip extends in the first direction and immediately adjacent to the first OD strip in a second direction, wherein the second OD strip defines active region of second-type MOS. The first doping region is disposed on the first OD strip, wherein the first doping region including a first-type dopant is configured to be a body terminal of a first second-type MOS on the second OD strip. The second doping region is disposed on the second OD strip, wherein the second doping region including a second-type dopant is configured to be a body terminal of a first first-type MOS on the first OD strip. The third doping region is disposed on the second OD strip, wherein the third doping region including a second-type dopant is configured to be a body terminal of a second first-type MOS on the first OD strip. The first doping region is located on a central axis of the second doping region and the third doping region, and the second direction is orthogonal with the first direction.

In some embodiments of the present disclosure, a semiconductor device is disclosed, including: a first cell, a second cell and a third cell. The first cell is disposed on a first OD strip, a second OD strip, a third OD strip and a fourth OD strip. The first cell includes a first doping region on the second OD strip, and the first doping region includes a first-type dopant and is configured to be a body terminal of a first first-type MOS formed on the first OD strip. The first cell further includes a second doping region on the third OD strip, and the second doping region includes the first-type dopant and is configured to be a body terminal of a second first-type MOS formed on the fourth OD strip. The second cell is disposed on the third OD strip, the fourth OD strip, a fifth OD strip and a sixth OD strip. The second cell includes a third doping region on the fourth OD strip, and the third doping region includes a second-type dopant and is configured to be a body terminal of a first second-type MOS formed on the third OD strip. The second cell further includes a fourth doping region on the fifth OD strip, and the fourth doping region includes the second-type dopant and is configured to be a body terminal of a second second-type MOS formed on the sixth OD strip. The third cell is disposed on the third OD strip, the fourth OD strip, the fifth OD strip and the sixth OD strip. The third cell includes a fifth doping region on the fourth OD strip, and the fifth doping region includes the second-type dopant and is configured to be a body terminal of a third second-type MOS formed on the third OD strip. The third cell further includes a sixth doping region on the fifth OD strip, and the sixth doping region includes the second-type dopant and is configured to be a body terminal of a fourth second-type MOS formed on the sixth OD strip. The first cell is located on a central axis of the second cell and the third cell.

What is claimed is:

1. A semiconductor device, comprising:
a first oxide definition (OD) strip doped by a first-type dopant in a first doping region defining an active region of a first Metal-Oxide Semiconductor (MOS);
a second OD strip doped by a second-type dopant in a second doping region and a third doping region, the second doping region defining an active region of a second MOS and the third doping region defining a body terminal of the first MOS, wherein the second OD is parallel to the first OD strip; and
a first dummy OD strip, wherein a boundary between the second doping region and the third doping region is formed over the first dummy OD strip;
wherein the first-type dopant is different from the second-type dopant.

2. The semiconductor device of claim 1, further comprising:
a third OD strip, extending in a first direction and immediately adjacent to the second OD strip in a second direction;
a fourth doping region, disposed on the third OD, wherein the fourth doping region includes the second-type dopant to define an active region of a third MOS;
a fifth doping region, disposed on the third OD strip, wherein the fifth doping region includes the second-type dopant;
a fourth OD strip, extending in the first direction and immediately adjacent to the third OD strip in the second direction; and
a sixth doping region, disposed on the fourth OD strip, wherein the sixth doping region includes the first-type dopant to define an active region of a fourth MOS, and the fifth doping region defines a body terminal of the fourth MOS.

3. The semiconductor device of claim 2, wherein the first-type dopant is p-type dopant while the second-type dopant is n-type dopant.

4. The semiconductor device of claim 2, wherein the first-type dopant is n-type dopant while the second-type dopant is p-type dopant.

5. A semiconductor device, comprising:
a first Oxide definition (OD) strip;
a second OD strip, parallel to the first OD strip;
a first doping region, disposed on the second OD strip, wherein the first doping region including a first-type dopant defines active region of second-type MOS;
a second doping region, disposed on the second OD strip, wherein the second doping region including a second-type dopant defines a body terminal of a first first-type MOS on the first OD strip; and
a dummy OD strip, intersected with the second OD strip, wherein a boundary between the first doping region and the second doping region is formed over the dummy OD strip;
wherein the first-type dopant is different from the second-type dopant.

6. The semiconductor device of claim 5, further comprising:
a third doping region, disposed on the second OD strip, wherein the third doping region including the second-type dopant defines a body terminal of a second first-type MOS on the first OD strip.

7. The semiconductor device of claim 6, further comprising:
a third OD strip, parallel to the second OD strip, wherein the third OD strip defines active region of second-type MOS;
a fourth OD strip, parallel to the third OD strip, wherein the fourth strip defines active region of first-type MOS;
a fourth doping region, disposed on the third OD strip, wherein the fourth doping region including the second-type dopant defines a body terminal of a third first-type MOS on the fourth OD strip; and
a fifth doping region, disposed on the third OD strip, wherein the fifth doping region including the second-type dopant defines a body terminal of a fourth first-type MOS on the fourth OD strip.

8. The semiconductor device of claim 7, further comprising:
a fifth OD strip, parallel to the first OD strip, wherein the fifth OD strip defines active region of first-type MOS;
a sixth OD strip, parallel to the fifth OD strip, wherein the sixth OD strip defines active region of second-type MOS;
a sixth doping region, disposed on the fifth OD strip, wherein the sixth doping region including the first-type dopant defines a body terminal of a second second-type MOS on the sixth OD strip.

9. The semiconductor device of claim 8, further comprising:
a seventh doping region, disposed on the first OD strip, wherein the seventh doping region including the first-type dopant defines a body terminal of a third second-type MOS on the second OD strip.

10. The semiconductor device of claim 9, further comprising:
an eighth doping region, disposed on the fifth OD strip, wherein the eighth doping region including the first-type dopant defines a body terminal of a fourth second-type MOS on the sixth OD strip.

11. The semiconductor device of claim 10, further comprising:
an ninth doping region, disposed on the first OD strip, wherein the ninth doping region including the first-type dopant defines a body terminal of a fifth second-type MOS on the second OD strip.

12. The semiconductor device of claim 11, further comprising:
a tenth doping region, disposed on the fifth OD strip, wherein the tenth doping region including the first-type dopant defines a body terminal of a sixth second-type MOS on the sixth OD strip.

13. The semiconductor device of claim 12, further comprising:
an eleventh doping region, disposed on the fourth OD strip, wherein the eleventh doping region including the first-type dopant defines a body terminal of seventh second-type MOS on the third OD strip.

14. The semiconductor device of claim 13, further comprising:
a seventh OD strip, parallel to the fourth OD strip, wherein the seventh OD strip defines active region of first-type MOS;
an eighth OD strip, parallel to the seventh OD strip, wherein the eighth OD strip defines active region of second-type MOS; and
a twelfth doping region, disposed on the seventh OD strip, wherein the twelfth doping region including the first-type dopant defines a body terminal of a eighth second-type MOS on the eighth OD strip.

15. The semiconductor device of claim 14, further comprising:
a thirteenth doping region, disposed on the fourth OD strip, wherein the thirteenth doping region including the first-type dopant defines a body terminal of a ninth second-type MOS on the third OD strip.

16. The semiconductor device of claim 15, further comprising:
a fourteenth doping region, disposed on the seventh OD strip, wherein the fourteenth doping region including the first-type dopant defines a body terminal of a tenth second-type MOS on the eighth OD strip.

17. The semiconductor device of claim 16, further comprising:
a first non-conductive strip and a second non-conductive strip, wherein a distance between the first non-conductive strip and the second non-conductive strip is a maximum length of an OD strip.

18. The semiconductor device of claim 17, wherein the first-type MOS is P-type MOS while the second-type MOS is NMOS, and the first-type dopant is P-type dopant while the second-type dopant is N-type dopant.

19. The semiconductor device of claim 17, wherein the first-type MOS is N-type MOS while the second-type MOS is P-type MOS, and the first-type dopant is N-type dopant while the second-type dopant is P-type dopant.

20. A semiconductor device, comprising:
a first cell, disposed on a first Oxide Definition (OD) strip, a second OD strip, a third OD strip and a fourth OD strip, wherein the first cell includes a first doping region on the second OD strip, and the first doping region includes a first-type dopant and defines a body terminal of a first first-type Metal-Oxide Semiconductor (MOS) formed on the first OD strip, and further includes a second doping region on the third OD strip, and the second doping region includes the first-type dopant and defines a body terminal of a second first-type MOS formed on the fourth OD strip;
a second cell, disposed on the third OD strip, the fourth OD strip, a fifth OD strip and a sixth OD strip, wherein the second cell includes a third doping region on the fourth OD strip, and the third doping region includes a second-type dopant and defines a body terminal of a first second-type MOS formed on the third OD strip, and further includes a fourth doping region on the fifth OD strip, and the fourth doping region includes the second-type dopant and defines a body terminal of a second second-type MOS formed on the sixth OD strip; and
a dummy OD strip, intersected with the second OD strip, wherein a boundary of the first doping region is formed over the dummy OD strip;
wherein the first-type dopant is different from the second-type dopant.

* * * * *